(12) United States Patent
McBride et al.

(10) Patent No.: US 10,795,836 B2
(45) Date of Patent: Oct. 6, 2020

(54) DATA PROCESSING PERFORMANCE ENHANCEMENT FOR NEURAL NETWORKS USING A VIRTUALIZED DATA ITERATOR

(71) Applicant: Microsoft Technology Licensing, LLC, Redmond, WA (US)

(72) Inventors: Chad Balling McBride, North Bend, WA (US); George Petre, Redmond, WA (US); Amol Ashok Ambardekar, Redmond, WA (US); Kent D. Cedola, Bellevue, WA (US); Larry Marvin Wall, Seattle, WA (US); Boris Bobrov, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 563 days.

(21) Appl. No.: 15/694,663

(22) Filed: Sep. 1, 2017

(65) Prior Publication Data

US 2018/0300633 A1    Oct. 18, 2018

Related U.S. Application Data

(60) Provisional application No. 62/486,432, filed on Apr. 17, 2017.

(51) Int. Cl.
*G06F 15/76*    (2006.01)
*G06F 13/16*    (2006.01)
(Continued)

(52) U.S. Cl.
CPC .......... *G06F 13/1673* (2013.01); *G06F 1/324* (2013.01); *G06F 1/3275* (2013.01);
(Continued)

(58) Field of Classification Search
None
See application file for complete search history.

(56) References Cited

U.S. PATENT DOCUMENTS 4,298,954 A    11/1981    Bigelow et al.
5,091,864 A    2/1992    Baji et al.
(Continued)

FOREIGN PATENT DOCUMENTS

EP    0147857 A2    7/1985
EP    2945290 A2    11/2015
(Continued)

OTHER PUBLICATIONS

"Non Final Office Action Issued in U.S. Appl. No. 15/702,311", dated May 21, 2019, 12 Pages.
(Continued)

*Primary Examiner* — Cheng Yuan Tseng
(74) *Attorney, Agent, or Firm* — Newport IP, LLC; Han Gim; Scott Y. Shigeta

(57) ABSTRACT

The performance of a neural network (NN) and/or deep neural network (DNN) can limited by the number of operations being performed as well as management of data among the various memory components of the NN/DNN. Using virtualized hardware iterators, data for processing by the NN/DNN can be traversed and configured to optimize the number of operations as well as memory utilization to enhance the overall performance of a NN/DNN. Operatively, an iterator controller can generate instructions for execution by the NN/DNN representative of one more desired iterator operation types and to perform one or more iterator operations. Data can be iterated according to a selected iterator operation and communicated to one or more neuron processors of the NN/DD for processing and output to a destination memory. The iterator operations can be
(Continued)

applied to various volumes of data (e.g., blobs) in parallel or multiple slices of the same volume.

20 Claims, 9 Drawing Sheets

(51) Int. Cl.
| | |
|---|---|
| *G06N 3/04* | (2006.01) |
| *G06N 3/063* | (2006.01) |
| *G06F 12/0862* | (2016.01) |
| *G06F 9/46* | (2006.01) |
| *G06F 1/324* | (2019.01) |
| *G06F 3/06* | (2006.01) |
| *G06F 9/38* | (2018.01) |
| *G06F 12/08* | (2016.01) |
| *G06F 12/10* | (2016.01) |
| *G06F 15/80* | (2006.01) |
| *G06F 17/15* | (2006.01) |
| *G06N 3/06* | (2006.01) |
| *G06N 3/08* | (2006.01) |
| *G06N 3/10* | (2006.01) |
| *H03M 7/30* | (2006.01) |
| *H04L 12/715* | (2013.01) |
| *H04L 29/08* | (2006.01) |
| *G06F 1/3234* | (2019.01) |
| *G06F 12/02* | (2006.01) |
| *G06F 13/28* | (2006.01) |
| *H03M 7/46* | (2006.01) |
| *H04L 12/723* | (2013.01) |

(52) U.S. Cl.
CPC ............ *G06F 3/0604* (2013.01); *G06F 3/067* (2013.01); *G06F 3/0631* (2013.01); *G06F 9/3887* (2013.01); *G06F 9/46* (2013.01); *G06F 12/0207* (2013.01); *G06F 12/08* (2013.01); *G06F 12/0862* (2013.01); *G06F 12/10* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/063* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1002* (2013.01); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(56) References Cited

U.S. PATENT DOCUMENTS

| | | | |
|---|---|---|---|
| 5,487,153 A | 1/1996 | Hammerstrom et al. | |
| 5,524,175 A | 6/1996 | Sato et al. | |
| 5,644,749 A | 7/1997 | Obayashi | |
| 5,859,990 A | 1/1999 | Yarch | |
| 5,933,654 A | 8/1999 | Galdun et al. | |
| 6,307,867 B1 | 10/2001 | Roobol et al. | |
| 6,654,730 B1 | 11/2003 | Kato et al. | |
| 6,785,239 B1 | 8/2004 | Tasker | |
| 6,990,079 B2 | 1/2006 | Vrabel | |
| 7,012,893 B2 | 3/2006 | Bahadiroglu | |
| 7,480,640 B1* | 1/2009 | Elad | G06Q 10/10 706/14 |
| 7,539,608 B1 | 5/2009 | Dageville et al. | |
| 7,694,084 B2* | 4/2010 | Raghavan | G06F 9/30036 711/154 |
| 8,244,953 B1 | 8/2012 | Kumar | |
| 8,442,927 B2 | 5/2013 | Chakradhar et al. | |
| 8,892,488 B2* | 11/2014 | Qi | G06F 40/30 706/45 |
| 8,966,413 B2* | 2/2015 | Shacham | G06F 30/30 716/100 |
| 9,015,096 B2* | 4/2015 | Hunzinger | G06N 3/049 706/45 |
| 9,143,393 B1* | 9/2015 | Bird | H04L 41/046 |
| 9,378,044 B1* | 6/2016 | Gaurav | G06F 9/5077 |
| 9,851,771 B2 | 12/2017 | Cooper et al. | |
| 9,990,307 B1 | 6/2018 | Patel et al. | |
| 10,275,001 B2 | 4/2019 | Kam et al. | |
| 2002/0133648 A1 | 9/2002 | Goudie et al. | |
| 2003/0065631 A1 | 4/2003 | McBride | |
| 2003/0120799 A1 | 6/2003 | Lahav et al. | |
| 2003/0200315 A1 | 10/2003 | Goldenberg et al. | |
| 2004/0187135 A1 | 9/2004 | Pronovost et al. | |
| 2005/0204189 A1 | 9/2005 | Akiba | |
| 2005/0216616 A1 | 9/2005 | Eldar et al. | |
| 2006/0047864 A1 | 3/2006 | Brokenshire et al. | |
| 2007/0145151 A1 | 6/2007 | Nakamura et al. | |
| 2008/0043742 A1 | 2/2008 | Pong et al. | |
| 2008/0052441 A1 | 2/2008 | Freking et al. | |
| 2008/0112438 A1 | 5/2008 | Ying et al. | |
| 2008/0313385 A1 | 12/2008 | Vijayakumar et al. | |
| 2008/0319933 A1 | 12/2008 | Moussa et al. | |
| 2009/0037697 A1 | 2/2009 | Ramani et al. | |
| 2009/0313195 A1 | 12/2009 | McDaid et al. | |
| 2010/0180100 A1 | 7/2010 | Lu et al. | |
| 2010/0257174 A1 | 10/2010 | Minuti | |
| 2010/0281192 A1 | 11/2010 | Rakib et al. | |
| 2011/0246722 A1 | 10/2011 | Taha et al. | |
| 2012/0130928 A1 | 5/2012 | Bell et al. | |
| 2012/0134449 A1 | 5/2012 | Chen et al. | |
| 2014/0046882 A1 | 2/2014 | Wood | |
| 2014/0181464 A1 | 6/2014 | Forsyth et al. | |
| 2014/0281221 A1 | 9/2014 | Wang et al. | |
| 2014/0372670 A1 | 12/2014 | Vasilyuk | |
| 2015/0363239 A1 | 12/2015 | Hsu et al. | |
| 2016/0098388 A1 | 4/2016 | Blevins et al. | |
| 2016/0184587 A1 | 6/2016 | Heuvel et al. | |
| 2016/0267377 A1* | 9/2016 | Pan | G06Q 30/0201 |
| 2016/0328644 A1 | 11/2016 | Lin et al. | |
| 2016/0335119 A1 | 11/2016 | Merrill et al. | |
| 2016/0350653 A1* | 12/2016 | Socher | G06N 5/04 |
| 2017/0011288 A1 | 1/2017 | Brothers et al. | |
| 2017/0199902 A1* | 7/2017 | Mishra | G06F 16/215 |
| 2018/0299943 A1 | 10/2018 | Mcbride et al. | |
| 2018/0300601 A1 | 10/2018 | Cedola et al. | |
| 2018/0300602 A1 | 10/2018 | Petre et al. | |
| 2018/0300603 A1 | 10/2018 | Ambardekar et al. | |
| 2018/0300604 A1 | 10/2018 | Mcbride et al. | |
| 2018/0300605 A1 | 10/2018 | Ambardekar et al. | |
| 2018/0300606 A1 | 10/2018 | Corkery et al. | |
| 2018/0300607 A1 | 10/2018 | Petre et al. | |
| 2018/0300613 A1 | 10/2018 | Petre et al. | |
| 2018/0300614 A1 | 10/2018 | Ambardekar et al. | |
| 2018/0300615 A1 | 10/2018 | Ambardekar et al. | |
| 2018/0300616 A1 | 10/2018 | Ambardekar et al. | |
| 2018/0300617 A1 | 10/2018 | Mcbride et al. | |
| 2018/0300634 A1 | 10/2018 | Mcbride et al. | |
| 2020/0233820 A1 | 7/2020 | Mcbride et al. | |

FOREIGN PATENT DOCUMENTS

| | | | |
|---|---|---|---|
| EP | 3035204 A1 | 6/2016 | |
| EP | 3035249 A1 | 6/2016 | |
| WO | 1993014459 A1 | 7/1993 | |
| WO | 2016118257 A1 | 7/2016 | |
| WO | 2016210030 A1 | 12/2016 | |

OTHER PUBLICATIONS

Chi, et al., "PRIME: A Novel Processing-in-memory Architecture for Neural Network Computation in ReRAM-based Main Memory",

(56) References Cited

OTHER PUBLICATIONS

In Proceedings of ACM/IEEE 43rd Annual International Symposium on Computer Architecture, Jun. 18, 2016, 13 pages.
"Non Final Office Action Issued in U.S. Appl. No. 15/702,311", dated Jun. 29, 2018, 10 Pages.
"International Search Report and Written Opinion Issued in PCT Application No. PCT/US2018/026358", dated Jul. 11, 2018, 15 Pages.
"International Search Report and Written Opinion Issued in PCT Application No. PCT/US2018/026352", dated Jun. 27, 2018, 11 Pages.
"International Search Report and Written Opinion Issued in PCT Application No. PCT/U52018/026353", dated Jul. 6, 2018, 15 Pages.
"International Search Report and Written Opinion Issued in PCT Application No. PCT/U52018/026354", dated Jul. 31, 2018, 15 Pages.
"International Search Report and Written Opinion Issued in PCT Application No. PCT/U52018/026355", dated Jul. 9, 2018, 16 Pages.
"International Search Report and Written Opinion Issued in PCT Application No. PCT/U52018/026356", dated Jul. 6, 2018, 16 Pages.
"International Search Report and Written Opinion Issued in PCT Application No. PCT/U52018/026357", dated Jul. 9, 2018, 16 Pages.
"Notice of Allowance Issued in U.S. Appl. No. 15/702,311", dated Sep. 11, 2019, 6 Pages.
"Ex Parte Quayle Action Issued in U.S. Appl. No. 15/950,644", dated Sep. 23, 2019, 7 Pages.
"Final Office Action Issued in U.S. Appl. No. 15/702,311", dated Nov. 5, 2018, 12 Pages.
"International Search Report & Written Opinion Issued in PCT Patent Application No. PCT/US18/027674", dated Jul. 13, 2018, 13 Pages.
"International Search Report & Written Opinion Issued in PCT Patent Application No. PCT/US18/027680", dated Sep. 27, 2018, 13 Pages.
"International Search Report & Written Opinion Issued in PCT Patent Application No. PCT/US18/027828", dated Aug. 3, 2018, 11 Pages.
"International Search Report & Written Opinion Issued in PCT Patent Application No. PCT/US18/027834", dated Jul. 24, 2018, 11 Pages.
"International Search Report & Written Opinion Issued in PCT Patent Application No. PCT/US18/027836", dated Aug. 3, 2018, 14 Pages.
"International Search Report & Written Opinion Issued in PCT Patent Application No. PCT/US18/027837", dated Aug. 3, 2018, 10 Pages.
"International Search Report & Written Opinion Issued in PCT Patent Application No. PCT/US18/027840", dated Jul. 30, 2018, 9 Pages.

\* cited by examiner

DATA PROCESSING PERFORMANCE ENHANCEMENT FOR NEURAL NETWORKS USING A VIRTUALIZED DATA ITERATOR

RELATED APPLICATION

This application claims priority under 35 U.S.C. Section 119(e) to U.S. Provisional Patent Application No. 62/486,432, filed on Apr. 17, 2017 and titled "Enhanced Neural Network Designs," the entire disclosure of which is incorporated in its entirety by reference herein.

BACKGROUND

In artificial neural networks (NN), a neuron is the base unit used to model a biological neuron in the brain. The model of an artificial neuron includes the inner product of an input vector with a weight vector added to a bias with a non-linearity applied. For deep neural networks (DNN) (e.g., as expressed by an exemplary DNN module), a neuron can be closely mapped to an artificial neuron.

In processing data across a NN or a DNN, the controller performing the exemplary processing operation is required to iterate over large amounts of data in order to apply the specific operation that can impact overall NN or DNN performance resulting in crucial latency to the detriment of a desired stated processing goal (e.g., identifying an object and/or object characteristic in exemplary input data—image, sound, geographic coordinates, etc.). Typically, existing NN and DNNs expend avoidable processing time (e.g., floating/fixed point operations per second (GFlops/s)) and memory space (e.g., number of bytes transferred per second (GBytes/s)) in performing various operations. Specifically, current practices do not identify critical features of input/data and/or provide instructions to the cooperating components of the NN or DNN regarding how best to process such input data to avoid such performance issues. Part in parcel with the performance impact associated with inefficient data processing in NN or DNN is the inefficient management between local and external memory components of the NN or DNN. Such inefficient data management requires additional, often avoidable, computations/neural processor operations further stressing overall NN/DNN performance.

A more advantageous NN/DNN would deploy one or more virtualized hardware iterators that, operatively, allow NN/DNN components, capable of specifying the dimensions of the data to iterate and provide one more instructions to the NN/DNN components, to iterate through the data. In order to support additional scaling, the hardware iterators can be deployed as single/multiple instances running alternatively/simultaneously, and/or the data can be characterized to allow for parallel processing operations.

It is with respect to these considerations and others that the disclosure made herein is presented.

SUMMARY

Techniques described herein provide for the virtualization of one or more hardware iterators to be utilized in an exemplary neural network (NN) and/or Deep Neural Network (DNN) environment, wherein the iterators (e.g., expressed as iterator controller components of the exemplary NN and/or DNN environment) operatively allow for the processing of data that improves overall performance and optimizes memory management. In an illustrative implementation, an exemplary DNN environment can comprise one or more processing blocks (e.g., computer processing units—CPUs), a memory controller, a high bandwidth fabric (e.g., data bus passing data and/or data elements between an exemplary DNN module and the cooperating components of a DNN environment), iterator controller, operation controller, and a DNN module. In the illustrative implementation, the exemplary DNN module can comprise an exemplary DNN state controller, a descriptor list controller (DLC), dMA (DDMA), DMA Streaming Activations (DSA), operation controller, load controller, and store controller.

In an illustrative operation, the operational controller of the NN/DNN environment can operatively iterate over large amounts of data in order to apply one or more desired data processing operations (e.g., convolution, max pooling, scalar multiply/add, summation, fully connected, etc.). In the illustrative operation, a participating user can specify the dimensions of the data being iterated and as well as the configuration on how to iterate through the data for use by the NN/DNN computing environment. Illustratively, the herein described iterators can operatively execute in multiple instances running alternatively to accommodate the parallel processing of one or more input data and/or one or more portions of a single input data. Illustratively, the internal state of the iterators can be saved into a dedicated cooperating memory for use by the exemplary iterator controllers to generate instructions when iterating data for processing by neuron processors of the exemplary NN/DNN environment.

In an illustrative implementation, data to be processed by the NN/DNN environment can be represented as a blob. Generally, a blob represents the data in memory that needs to be iterated. Each blob can maintain a logical mapped shape defined by various dimensions such as width, height, number of channels, number of kernels, and other available dimensional units. In an illustrative operation, the iterator can traverse across a multi-dimensional blob (e.g., as defined by a logical data mapping) or a smaller N dimensional slice of such a blob, where N is the number of dimensions (e.g., for a 3D blob representing an image with width, height and number of channels—N=3). While traversing the blob, the iterator controller can generate one or more instructions including, but not limited to, load instructions for loading data from the source memory to the processing unit(s) (e.g., neural processors), or store instructions for storing data produced by the processing unit(s) to a destination memory (e.g., cooperating memory component of the NN/DNN environment). In the illustrative operation, the iterator controller is capable of producing instructions that read/write multiple data concurrently.

Illustratively, the iterator controller can expose a number of operations (operation type) for the NN/DNN environment to execute including, but not limited to: an initialization control that can allow the iteration across a specific blob instance; a fill control which can allow for the extraction of data from an exemplary blob at the current position; a skip control that can allow for the advancement of internal data pointers without extracting any data; an EndOfBlob flag that allows for communication to a participating user of the completion of a blob traversal; a reset control that can allow for the processing of a blob at the first data position; a save control that can allow for the storage of the internal state of the iterator controller to an external memory location for future reuse; and a restore control that can allow for the internal state stored on a cooperating external memory to be restored for use by the NN/DNN environment. Additional controls and/or flags can be implemented and executed by the NN/DNN environment as required to process data.

In an illustrative operation, the iterator controller can provide instructions to the NN/DNN environment to traverse the blob memory using one or more selected traversal patterns which can be specific to each iterator controller operation and which can be further configured by the iterator controller. In the illustrative operation, the iterator controller can allow for the reading/writing of data at a position described by a stored internal state as well as the subsequent processing of the data. The order in which the data can be read from/written to memory can be asynchronous and can depend on iterator controller operation type and configuration data for the specific operation type. Moreover, the operation controllers implementing each layer type make use of one or more multiple iterator types in order to extract the data from memory for processing and then to save the data to the memory after the processing is completed.

Further, the iterator controller can allow for multiple instances of the same iterator operation type to be executed. In an illustrative operation, multiple iterator operation types can be executed in parallel, operatively achieved by storing/retrieving states of the iterator operation types in memory. As a further enhancement to performance of the NN/DNN environment, when a single instance of the same iterator type is in use, the iterator can be configured to skip the save/restore action and return to an initial state.

In an illustrative operation, the exemplary iterator controller can provide instructions to execute a blob iterator operation type (i.e., BlobIterator). In the illustrative operation, the BlobIterator can have one or more instructions to traverse a blob in chunks of partially contiguous data, and/or one or more instructions to traverse named volumes for communication to one or more neuron processors. A volume can represent data from the blob needed to be processed by n neurons to produce n output values. This data can either be contiguous and processed sequentially, or be dis-contiguous and processed at multiple times.

The data read by the BlobIterator can be communicated to one or more neuron processors for processing. Operatively, the neuron processor can maintain a first-in-first-out (FIFO) bus where it can operatively receive the data that it will process. The BlobIterator can communicate the traversed blob data to allow for the portioning of the blob data into the n neuron processor FIFOs by placing a selected amount (e.g., equal amount) of values in each of the neuron processor FIFOs.

Specific to iterator controller operation type Fill commands, the BlobIterator can read a multiple of blob volume width lines of data from a cooperating memory and for each of the volume lines it can distribute the values mapping from the one or more neuron processors to the respective neuron processors FIFOs. The data on the same volume line can be read and then distributed to multiple neuron processor FIFOs.

Specific to blobs having a width that is not a multiple of the volume width, operatively, the iterator controller can provide instructions to process the volume that can straddle multiple lines of volume width lines. In an illustrative operation, the instructions provided by the iterator controller allow the BlobIterator to traverse the blob using a multiple volume width line straddle operation.

In an illustrative operation, the BlobIterator can allow for the addition of a padding volume to the blob dynamically at runtime. The operation controller can specify how much padding to be used on each of the dimensions of the blob, and the BlobIterator can keep track of that padding volume as if it were present in a cooperating physical memory The padding can then be made available for the next operation.

In an illustrative operation, the exemplary iterator controller can provide instructions to execute an output iterator operation type (e.g., OutputIterator). In an illustrative operation, the OutputIterator can store data produced by the one or more neuron processors into an output blob. The OutputIterator can be configured with the dimensions of the output blob and the n number of neuron processors producing data to generate one or more instructions for storing the processed data into the destination memory. Illustratively, the OutputIterator can write either the full blob or only some sections of the blob.

It should be appreciated that, although described in relation to a system, the above-described subject matter may also be implemented as a computer-controlled apparatus, a computer process, a computing system, or as an article of manufacture such as a computer-readable medium and/or dedicated chipset. These and various other features will be apparent from a reading of the following Detailed Description and a review of the associated drawings. This Summary is provided to introduce a selection of concepts in a simplified form that are further described below in the Detailed Description.

This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with a letter of a sequence of letters to refer to each individual item. Generic references to the items may use the specific reference number without the sequence of letters.

DETAILED DESCRIPTION

Figure 1:
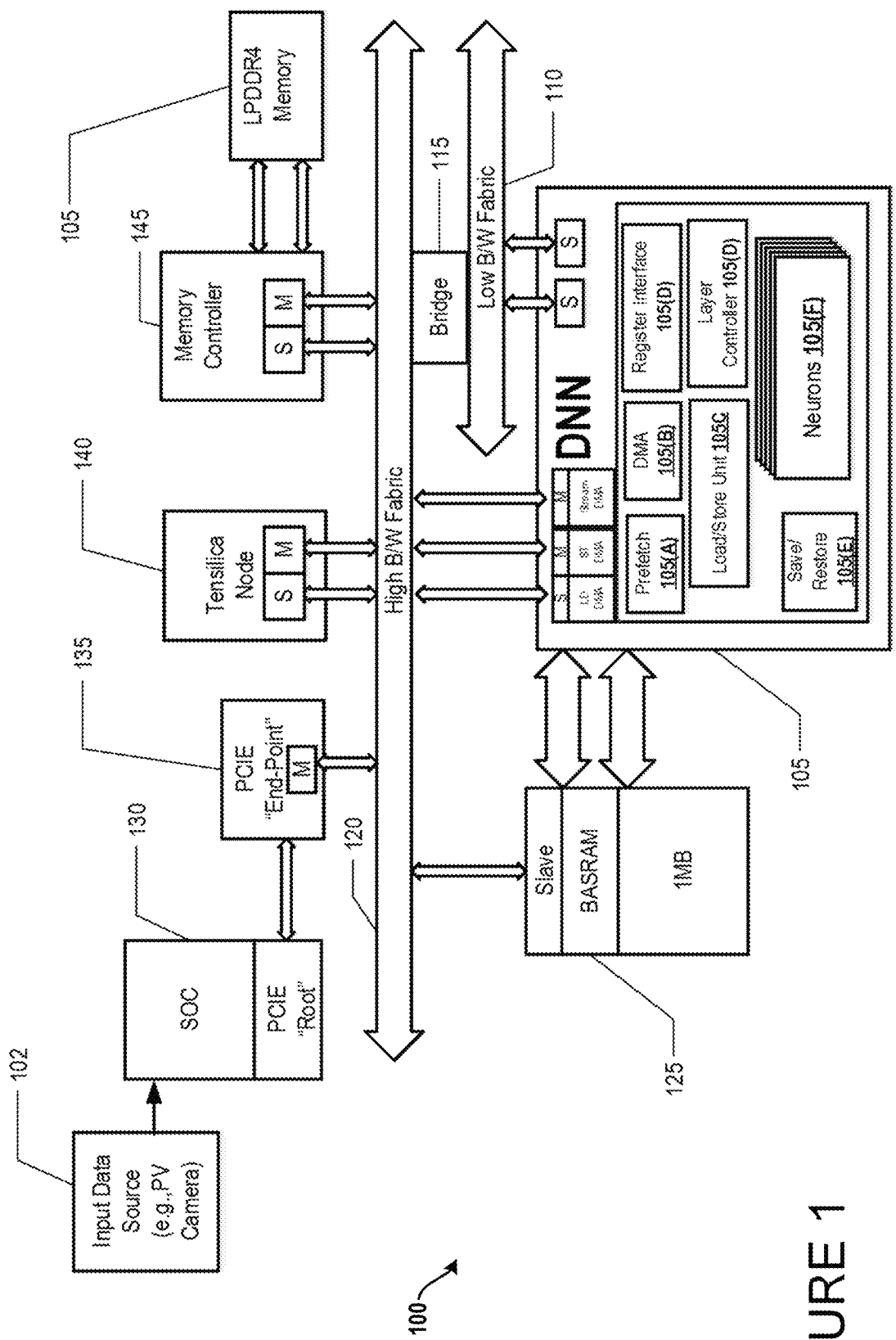
FIG. 1 illustrates a block diagram of an exemplary neural networking computing environment in accordance with the herein described systems and methods.

The following Detailed Description describes techniques that provide for the virtualization of one or more hardware iterators utilized in an exemplary neural network (NN) and/or Deep Neural Network (DNN) environment. In general, the iterators (e.g., expressed as iterator controller components of the exemplary NN and/or DNN environment) operatively allow for the processing of data that improves overall performance and optimizes memory management. In an illustrative implementation, an exemplary DNN environment can comprise one or more processing blocks (e.g., computer processing units—CPUs), a memory controller, a high bandwidth fabric (e.g., data bus passing data and/or data elements between an exemplary DNN module and the cooperating components of a DNN environment), iterator controller, operation controller, and a DNN module. In the illustrative implementation, the exemplary DNN module can comprise an exemplary DNN state controller, a descriptor list controller (DLC), dMA (DDMA), DMA Streaming Activations (DSA), operation controller, load controller, and store controller.

In an illustrative operation, the operational controller of the NN/DNN environment can operatively iterate over large amounts of data in order to apply one or more desired data processing operations (e.g., convolution, max pooling, scalar multiply add, summation, fully connected, etc.). In the illustrative operation, a participating user can specify the dimensions of the data being iterated as well as the configuration for iteration through the data for use by the NN/DNN computing environment. Illustratively, the herein described iterators can operatively execute in multiple instances running independently to accommodate for the parallel processing of one or more input data and/or one or more portions of a single input data. Illustratively, the internal state of the iterators can be saved into a dedicated cooperating memory for use by the exemplary iterator controllers to generate instructions when iterating data for processing by neuron processors of the exemplary NN/DNN environment.

In an illustrative implementation, data to be processed by the NN/DNN environment can be represented as a blob. Generally, a blob represents the data in memory that needs to be iterated. Each blob can maintain a logical mapped shape defined by various dimensions such as width, height, number of channels, number of kernels, and other available dimensional units. In an illustrative operation, the iterator can traverse across a multi-dimensional blob (e.g., as defined by a logical data mapping) or a smaller N dimensional slice of such a blob, where N is the number of dimensions (e.g., for a 3D blob representing an image with width, height and number of channels—N=3). While traversing the blob, the iterator controller can generate one or more instructions including, but not limited to, load instructions for loading data from the source memory to the processing unit(s) (e.g., neuron processors), or store instructions for storing data produced by the processing unit(s) to a destination memory (e.g., cooperating memory component of the NN/DNN environment). In the illustrative operation, the iterator controller is capable of producing instructions that read/write multiple data concurrently.

Illustratively, the iterator controller can expose a number of operations (operation type) for the NN/DNN environment to execute including, but not limited to: an initialization control that can allow the iteration across a specific blob instance; a fill control which can allow for the extraction of data from an exemplary blob at the current position; a skip control that can allow for the advancement of internal data pointers without extracting any data; an EndOfBlob flag that allows for the communication to a participating user of the completion of a blob traversal; a reset control that can allow for the processing of a blob at the first data position; a save control that can allow for the storage of the internal state of the iterator controller to an external memory location for future reuse; and a restore control that can allow for the internal state stored on a cooperating external memory to be restored for use by the NN/DNN environment. Additional controls and/or flags can be implemented and executed by the NN/DNN environment as required to process data.

In an illustrative operation, the iterator controller can provide instructions to the NN/DNN environment to traverse the blob memory using one or more selected traversal patterns which can be specific to each iterator controller operation and which can be further configured by the iterator controller. In the illustrative operation, the iterator controller can allow for the reading/writing of data at a position described by a stored internal state as well as the subsequent processing of the data. The order in which the data can be read from/written to memory can be asynchronous and can depend on iterator controller operation type and configuration data for the operation type provided. Moreover, the operation controllers implementing each layer type can make use of one or multiple iterator types in order to extract the data from memory for processing and then to save the data to the memory after the processing is completed.

Further, the iterator controller can allow for multiple instances of the same iterator operation type to be executed. In an illustrative operation, multiple iterator operation types can be executed in parallel which is operatively achieved by storing/retrieving states of the iterator operation types in memory. As a further enhancement to performance of the NN/DNN environment, when a single instance of the same iterator type is in use, the iterator can be configured to skip the save/restore action and return to an initial state.

In an illustrative operation, the exemplary iterator controller can provide instructions to execute a blob iterator operation type (i.e., BlobIterator). In the illustrative operation, The BlobIterator can have one or more instructions to traverse a blob in chunks of partially contiguous data, and/or one or more instructions to traverse named volumes for communication to one or more neuron processors. A volume can represent data from the blob needed to be processed by n neurons to produce n output values. This data can either be contiguous and processed sequentially, or be dis-contiguous and processed at multiple times.

The data read by the BlobIterator can be communicated to one or more neuron processors for processing. Operatively, the neuron processor can maintain a first-in-first-out (FIFO) bus where it can operatively receive the data that it will process. The BlobIterator can communicate the traversed blob data (also referred to herein as "traversed blob data" or "selected data") to allow for the portioning of the blob data into the n neuron processor FIFOs by placing a selected amount (e.g., equal amount) of values in each of the neuron processor FIFOs. In some configurations, the techniques disclosed herein can include processing the one or more instructions to select one or more portions of the loaded data according to one or more iterator operation types and the one or more initialization parameters, then communicating the one or more portions of the loaded data to one or more processing components of the neural network environment. For illustrative purposes, the one or more portions of the loaded data are also referred to herein as "traversed blob data" or "selected data."

Specific to iterator controller operation type Fill commands, the BlobIterator can read a multiple of blob volume width lines of data from a cooperating memory, and for each of the volume lines it can distribute the values mapping to the one or more of the neuron processors to the respective neuron processor FIFOs. The data on the same volume line can be read and then distributed to multiple neuron processor FIFOs.

Specific to blobs having a width that is not a multiple of the volume width, operatively, the iterator controller can provide instructions to process the volume that can straddle multiple lines of volume width lines. In an illustrative operation, the instructions provided by the iterator controller allow the BlobIterator to traverse the blob using a multiple volume width line straddle operation.

In an illustrative operation, the BlobIterator can allow for the addition of a padding volume to the blob dynamically at runtime. The operation controller can specify how much padding to be used on each of the dimensions of the blob and the BlobIterator can keep track of that padding volume as if it were present in a cooperating physical memory. The padding can then be made available for the next operation.

In an illustrative operation, the exemplary iterator controller can provide instructions to execute an output iterator operation type (e.g., OutputIterator). The OutputIterator can store data produced by the one or more neuron processors into an output blob. The OutputIterator can be configured with the dimensions of the output blob and the n number of neuron processors producing data to generate one or more instructions for storing the processed data into the destination memory. Illustratively, the OutputIterator can write either the full blob or only some sections of the blob.

Neural Networks Background

In artificial neural networks, a neuron is the base unit used to model a biological neuron in the brain. The model of an artificial neuron can include the inner product of an input vector with a weight vector added to a bias, with a non-linearity applied. Comparatively, a neuron, in an exemplary DNN module, (e.g., 105 of FIG. 1) is closely mapped to an artificial neuron.

Illustratively, the DNN module can be considered a superscalar processor. Operatively, it can dispatch one or more instructions to multiple execution units called neurons. The execution units can be "simultaneous dispatch simultaneous complete" where each execution unit is synchronized with all of the others. A DNN module can be classified as a SIMD (single instruction stream, multiple data stream) architecture.

Turning to exemplary DNN environment 100 of FIG. 1, DNN module 105 has a memory subsystem with a unique L1 and L2 caching structure. These are not traditional caches, but are designed specifically for neural processing. For convenience, these caching structures have adopted names that reflect their intended purpose. By way of example, the L2 cache 125(A) can illustratively maintain a one megabyte (1 MB) storage capacity with a high speed private interface operating at 16 GBps. The L1 cache can maintain an 8 KB storage capacity split between kernel and activation data. The L1 cache can be referred to as Line Buffer, and the L2 cache is referred to as BaSRAM.

The DNN module can be a recall-only neural network and programmatically support a wide variety of network structures. Training for the network can be performed offline in a server farm or data center; the DNN module does not perform any training functions. The result of training is a set of parameters that can be known as either weights or kernels. These parameters represent a transform function that can be applied to an input with the result being a classification or semantically labeled output.

In an illustrative operation, the DNN module can accept planar data as input. Input is not limited to image data only, as long as the data presented is in a uniform planar format the DNN can operate on it.

The DNN module operates on a list of layer descriptors which correspond to the layers of a neural network. Illustratively, the list of layer descriptors can be treated by the DNN module as instructions. These descriptors can be pre-fetched from memory into the DNN module and executed in order.

Generally, there can be two main classes of layer descriptors: 1) Memory-to-memory move descriptors, and 2) Operation descriptors. Memory-to-memory move descriptors can be used to move data to/from the main memory to/from a local cache for consumption by the operation descriptors. Memory-to-memory move descriptors follow a different execution pipeline than the operation descriptors. The target pipeline for memory-to-memory move descriptors can be the internal DMA engine, whereas the target pipeline for the operation descriptors can be the neuron processing elements. Operation descriptors are capable of many different layer operations.

The output of the DNN is also a blob of data. The output can optionally be streamed to a local cache or streamed to main memory. The DNN module can pre-fetch data as far ahead as the software will allow. Software can control pre-fetching by using fencing and setting dependencies between descriptors. Descriptors that have dependencies sets are prevented from making forward progress until the dependency has been satisfied.

Turning now to FIG. 1, an exemplary neural network environment 100 can comprise various cooperating components inclusive of DNN module 105, cache memory 125(A), low bandwidth fabric 110, bridge component 115, high bandwidth fabric 120, SOC 130, PCIE "End Point" 135, Tensilica Node 140, memory controller 145, LPDDR4 memory 105, and an input data source 102. Further, as is shown, DNN module 105 can also comprise a number of components comprising prefetch 105(A), DMA 105(B), Register Interface 105(D), load/store unit 105(C), layer controller 105(D), save/restore component 105(E), and neurons 105(F). Operatively, an exemplary DNN environment 100 can process data according to a selected specification wherein the DNN module performs one or more functions as described herein.

Figure 2:
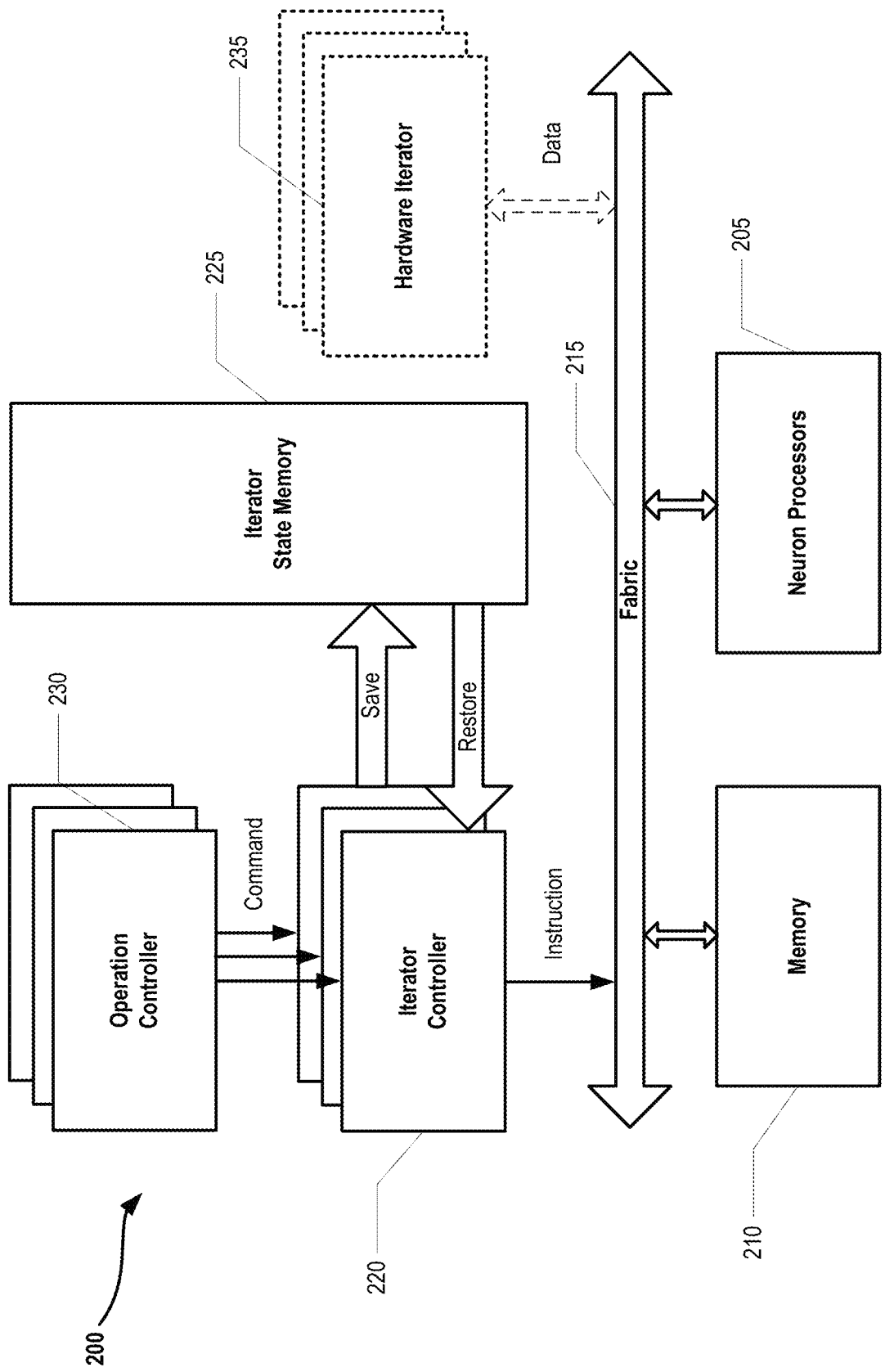
FIG. 2 illustrates a block diagram of an exemplary neural networking environment utilizing one or more virtualized hardware iterators.

FIG. 2 illustrates an exemplary neural network environment 200 operable to employ one or more virtualized hardware iterators as part of data processing. As is shown, the exemplary neural network environment 200 (also referred to herein as a computing device or a computing device environment) comprises one or more operation controllers 230 that cooperate with one or more iterator controllers 220 to provide one or more commands for execution. The one or more iterator controllers 220 illustratively operate to generate instructions that are communicated through exemplary fabric 215 to cooperating memory component 210 as well as one or more neuron processors 205. A neural network environment fabric can be a data bus capable of passing through various data. Furthermore, as is shown, one or more iterator controllers 220 can operatively cooperate with iterator state memory 225 to save and restore iterator state memory data (not shown).

Figure 6:
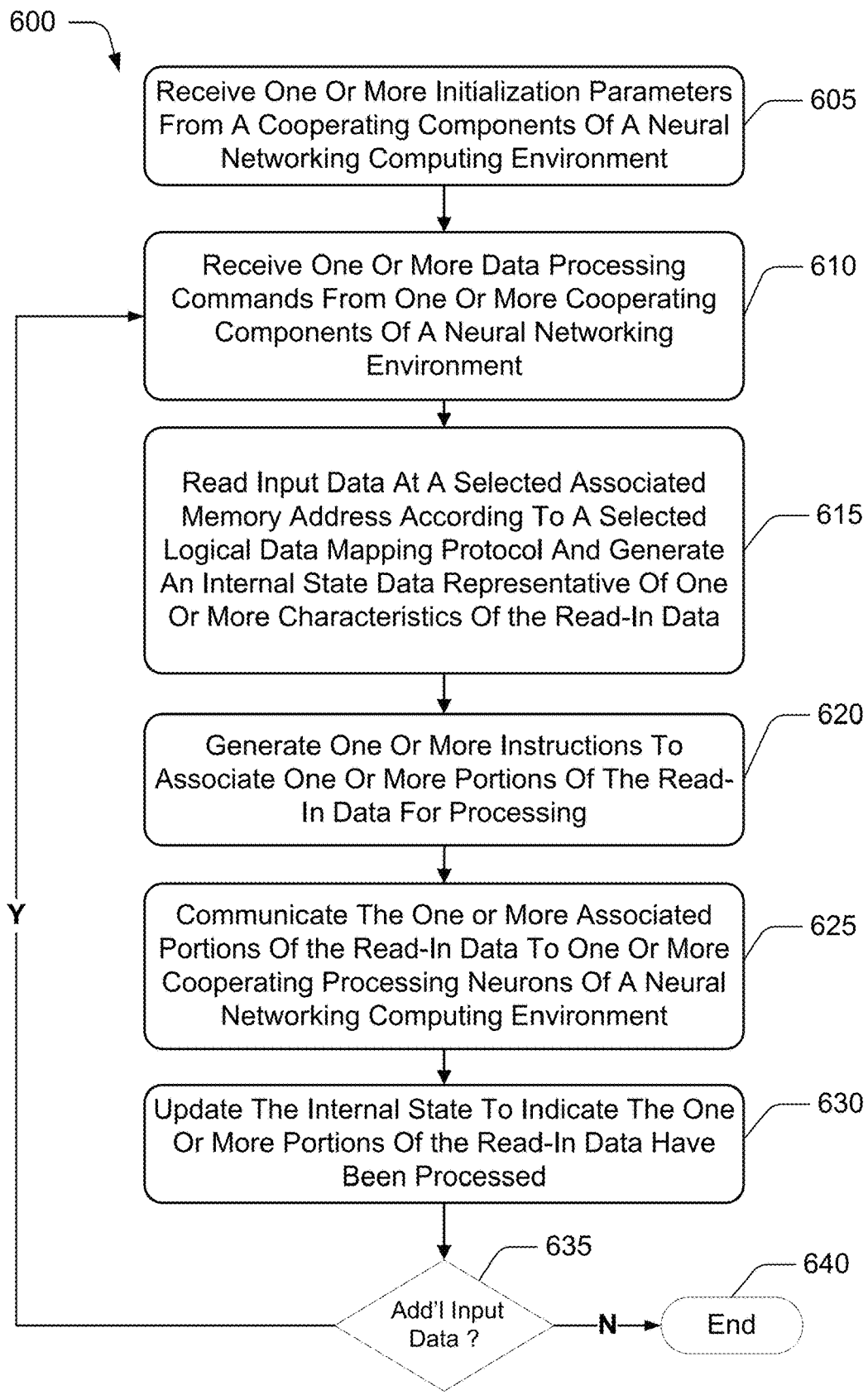
FIG. 6 is a flow diagram of an illustrative process to allow for the iteration of data for processing in an illustrative neural network computing environment according to the herein described systems and methods.
Figure 7:
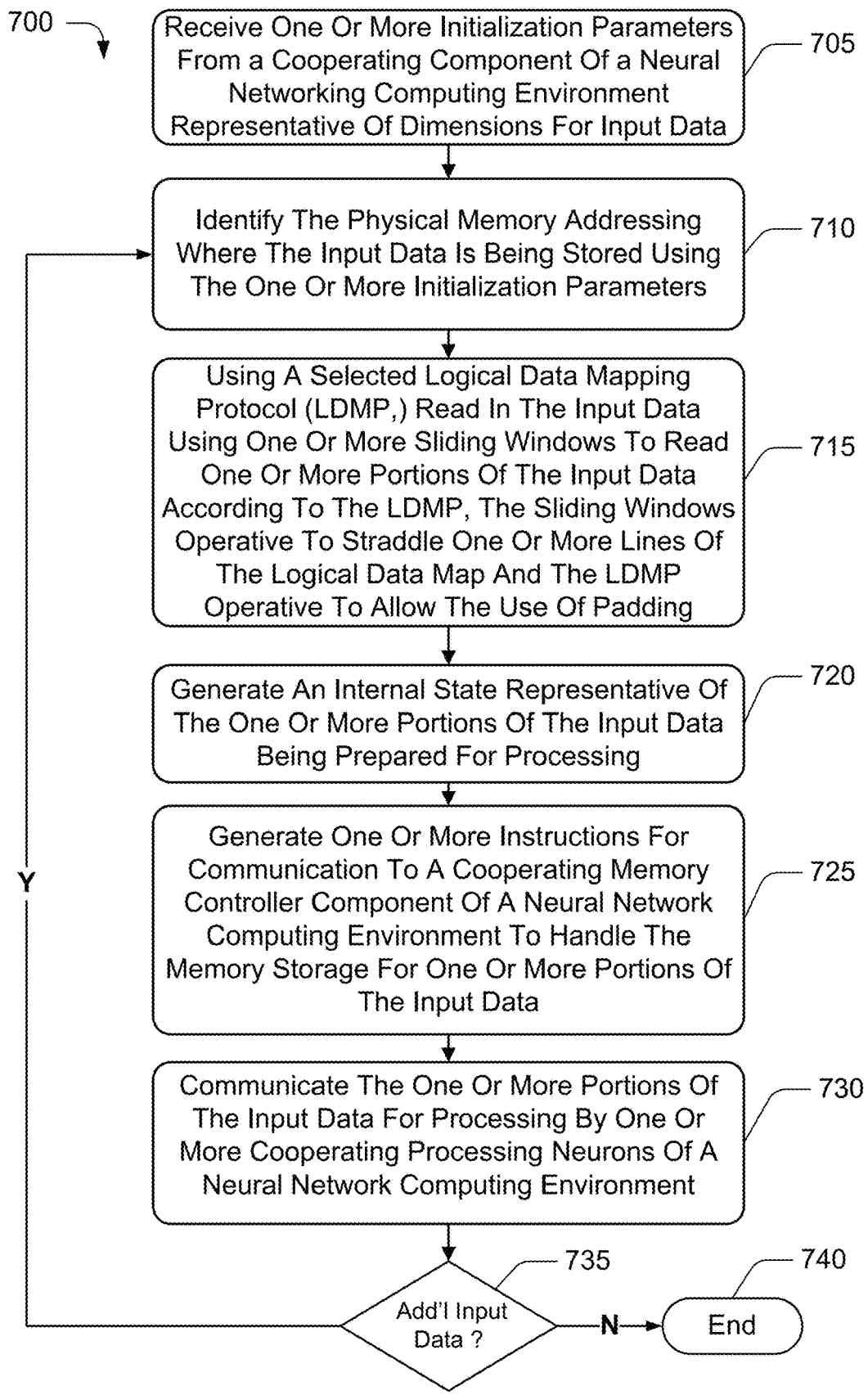
FIG. 7 is a flow diagram of an illustrative process for the iteration of data for processing in an illustrative neural networking computing environment utilizing a selected logical data mapping protocol operative to provide for data padding and straddled sliding windows in accordance with the herein described systems and methods.

In the illustrative operation, the exemplary neural network environment 200 can operatively process data according to the process described in FIGS. 6 and 7. Specific to the components described in FIG. 2, these components are merely illustrative, as one of ordinary skill in the art would appreciate the processing described in FIGS. 6 and 7 to be performed by other components than those illustrated in FIG. 2.

Also, as is shown in FIG. 2, exemplary neural network environment can optionally include one or more hardware iterators (as indicated by the dashed lines) that can illustratively operate to iterate input data (not shown) for processing by one more neuron processors 205. It is appreciated by one skilled in the art that such optional inclusion of exemplary one or more hardware iterators is merely illustrative as the inventive concepts described by the herein disclosed systems and methods are operative in a an exemplary neural network environment 200 operating without any hardware iterators.

Figure 3:
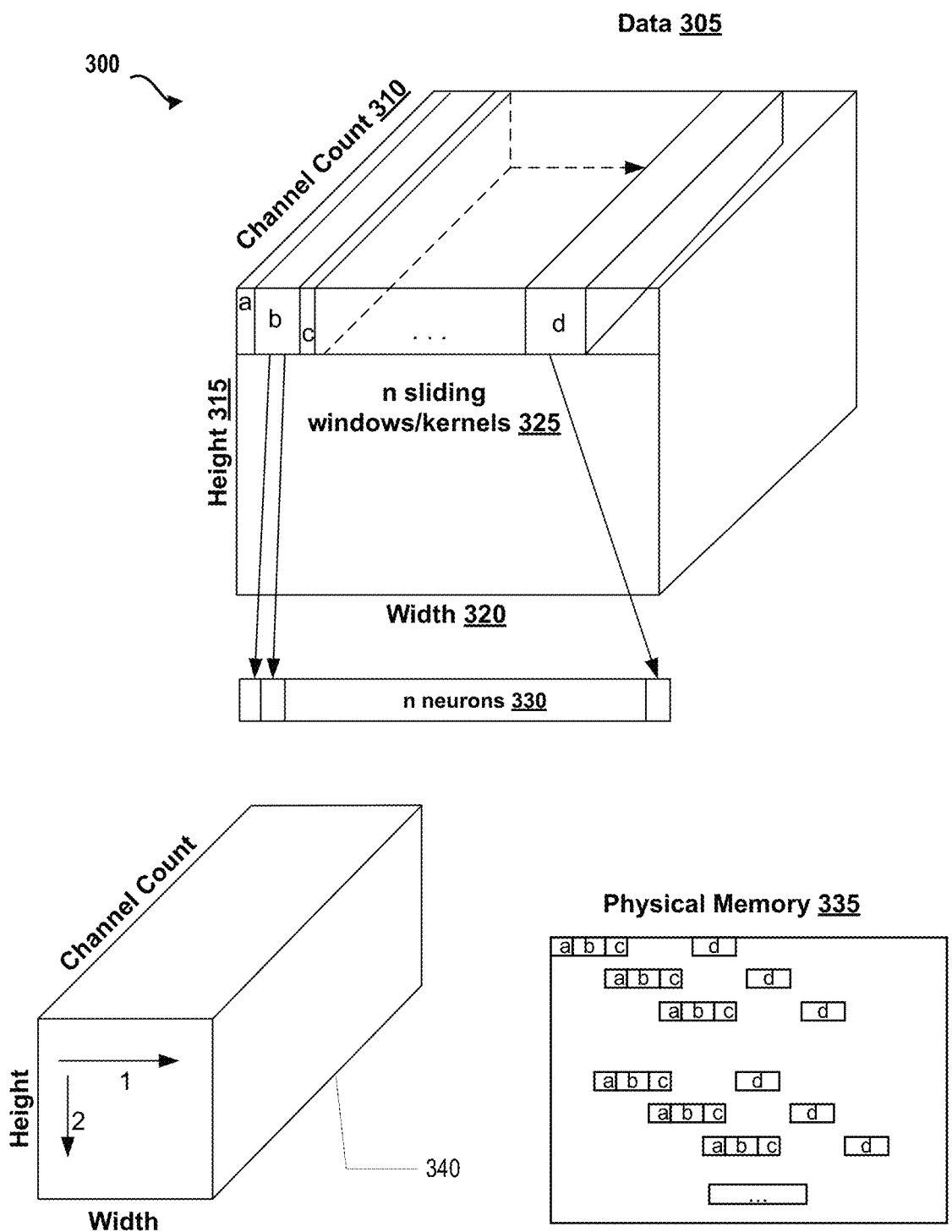
FIG. 3 illustrates a block diagram of exemplary input data represented in an illustrative logical data mapping according to the herein described systems and methods.

FIG. 3 illustrates an example logical data mapping 300 for exemplary input data. As is shown, data 305 can be represented as data having a certain dimension and volume 340 comprising channel count 310, height 315, and width 320. According to the herein described systems and methods, data 305 can be portioned and prepared for processing by cooperating n neurons 330 such that first portion a can be communicated to a first neuron, second portion b can be communicated to a second neuron, and so forth until n portions are communicated to n neurons.

In an illustrative operation, the portions of data 305 can be determined using n sliding window/kernels 325 based on one or more instructions provided by a cooperating controller component of an exemplary neural network environment (e.g., 200 of FIG. 2). Further as is shown, the input data portions a, b, c, and d can be addressed to a physical memory 325 using one or more initialization parameters provided by a cooperating operation controller component of an exemplary neural network environment (e.g., 200 of FIG. 2).

Figure 4:
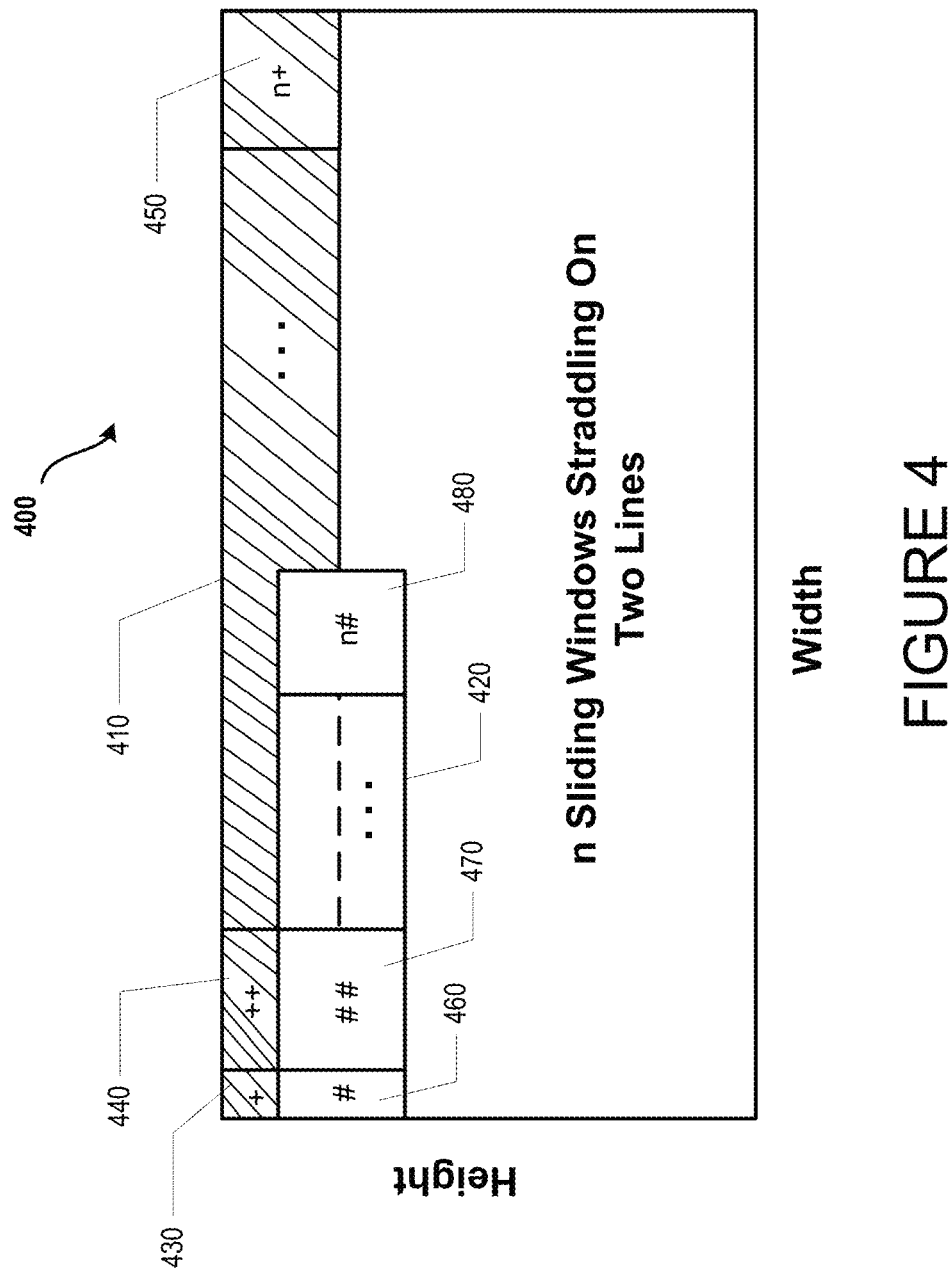
FIG. 4 illustrates a block diagram of exemplary input data represented in an illustrative logical data mapping showing the use of illustrative n sliding windows operative to straddle one or more lines of the illustrative logical data mapping.

FIG. 4, illustrates an exemplary logical data map 400 of exemplary input data (not shown). Exemplary logical data map 400 comprises a first line 410 (illustrated with diagonal marks) and a second line 420 (illustrated by dashes). Each map line can include a number of sliding windows (e.g., 430, 440, and 450 for the first line 410 and 460, 470, and 480 for the second line 420). Additionally, as is shown, the logical data map 400 shows the ability of the sliding windows to straddle a data dimensional boundary of the input data (e.g., straddling the first line 410 and the second line 420). Such ability allows for increased performance as more data can be prepared more efficiently for subsequent processing by the cooperating neural network processing components (e.g., 205 of FIG. 2).

Figure 5:
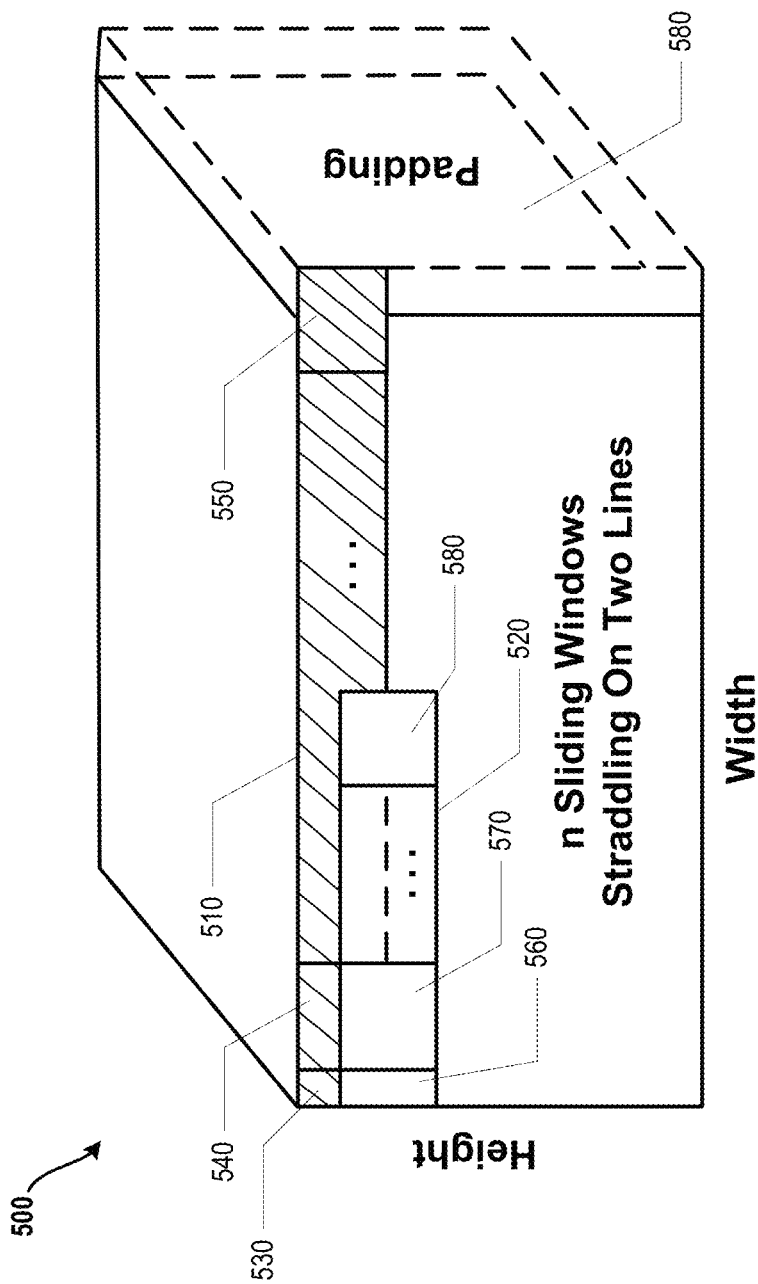
FIG. 5 illustrates a block diagram of exemplary input data represented in an illustrative logical data mapping showing the use of illustrative n sliding windows operative to straddle one or more lines of the illustrative logical data mapping operative to allow for data padding as a processing enhancement in accordance with the herein described systems and methods.

FIG. 5 is similar to FIG. 4 and is presented to described the ability of the herein described systems and methods to allow for the use of padding to further enhance the performance characteristics of an exemplary neural network environment (e.g., 100 of FIG. 1 and 200 of FIG. 2). As is shown, logical data map 500 (of exemplary input data not shown) can include various sliding windows (530, 540, 550, 560, 570, and 580) that straddle across one or more lines (e.g., 510 and 520). Additionally, the logical data map 500 can also include padding 580.

In an illustrative operation, at runtime of an exemplary neural network environment (100 of FIG. 1 or 200 of FIG. 2), padding 580 can be added dynamically. The operation controller 230 of FIG. 2 can specify the amount of padding to be used on each of the dimensions shown in FIG. 3 (collectively volume 340) of the input data (e.g., blob), and the neural network environment (e.g., iterator controller instructions) can operatively construct data volumes as if the padding was physically present in memory. Default values can also be generated by the exemplary neural network environment (e.g., iterator controller instructions) in the iterator output positions where the padding was added.

FIG. 6 is a flow diagram of an illustrative process 600 to enhance performance of a neural network environment utilizing virtualized hardware iterators. As is shown, processing begins at block 605 where one or more initialization parameters are received from one or more cooperating components of a neural networking computing environment. Processing then proceeds to block 610 where one more data processing commands are received from one or more cooperating components of a neural networking computing environment. Illustratively, exemplary processing commands can include iterator operation types. At block 615, input data is read at a selected associated memory address according to a selected logical data mapping protocol (LDMP) and an internal state data is generated, the internal state data being representative of one or more characteristics of the read-in data. From there, processing proceeds to block 620 where one or more instructions to associate one or more portions of the read-in data for processing is generated. The one or more associated portions of the read-in data is then communicated to one or more cooperating processing neurons of a neural networking computing environment at block 325. The internal state is then updated at block 630 to indicate the one or more portions of the read-in data have been communicated to the neurons for processing. A check is then performed at block 635 to determine if there is additional input data required for processing by the neural network environment. If the check indicates there is no additional data, processing terminates at block 640. If additional data requires processing by the neural network environment, processing reverts to block 610 and proceeds from there.

In an illustrative operation, a hardware iterator can be virtualized by providing logical mapping to in-memory data. The mapping is calculated using parameters that describe the data's physical memory addressing, dimension, and volume. Additionally, instructions regarding how to traverse the logical data map are generated to allow for the efficient loading (i.e., from/to memory) of the data to be prepared for processing by the neural network neurons based on the operation that is being performed by the neural network neurons as well as the data's dimension and volume description.

FIG. 7 is a flow diagram of an illustrative process 700 utilizing one or more virtualized hardware iterators to enhance the performance for a NN/DNN environment. As is shown, processing begins at block 705 where one or more initialization parameters are received from a cooperating component of the neural network environment (e.g., operation controller) wherein the one or more initialization parameters can include data representative of the dimensions for input data. Processing then proceeds to block 710 where one or more physical addresses of the input data are identified using the received one or more of the initialization parameters. The input data is then read-in (e.g., loaded) at block 715 using a selected logical data mapping protocol (LDMP). Illustratively, at block 715, the logical data mapping protocol can utilize sliding windows (as depicted in FIG. 3) to associate (e.g., read-in) one or more portions of the input data with the received initialization parameters to collate the input data into one or more portions for subsequent processing. Further the LDMP can allow for straddled windows and logical data padding as part of preparing the input data for processing.

Processing then proceeds to block 720 where an internal state representative of the collated one or more portions of the input data is generated. From there, one or more instructions are generated to instruct a cooperating memory controller component of the neural network environment to handle the memory storage for one or more portions of the input data being prepared for processing at block 725. Processing then proceeds to block 730 where the prepared one or more portions of the input data are communicated to one or more cooperating processing components (e.g., neural processors) of a neural network environment for processing.

Illustratively, and as is depicted in FIG. 3, an exemplary logical data mapping protocol can operatively render two-dimensional flat-file type data as a multi-dimensional characterized data such that the input data can be visually represented as a blob having a certain height, width, depth (e.g., number of channels), slices of depth (e.g., number of kernels). This logical data mapping allows for the use of siding windows to associate one or more data elements of the input data for an iteration operation. Illustratively, the sliding windows can straddle two logically mapped input data width lines.

A check is then performed at block 735 to determine if there is additional input data to be processed (i.e., as part of an iteration operation). If there is no additional input data, processing terminates at block 740. However, if additional input data requires an iteration operation, processing then reverts to block 710 and proceeds from there.

Figure 8:
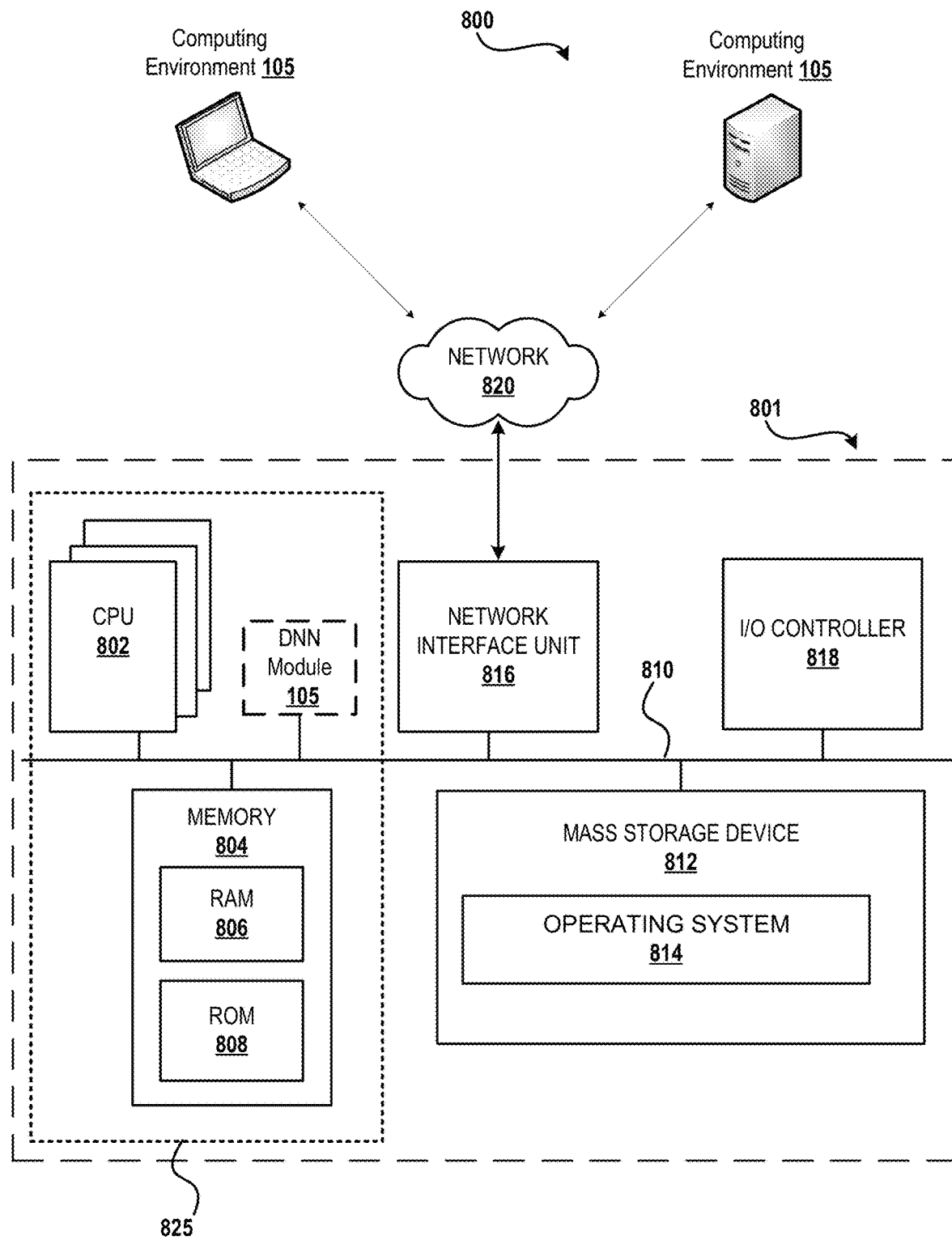
FIG. 8 shows additional details of an illustrative computer architecture for a computer capable of executing the herein described methods.

The computer architecture 800 illustrated in FIG. 8 includes a central processing unit 802 ("CPU"), a system memory 804, including a random-access memory 806 ("RAM") and a read-only memory ("ROM") 808, and a system bus 810 that couples the memory 804 to the CPU 802. A basic input/output system containing the basic routines that help to transfer information between elements within the computer architecture 800, such as during startup, is stored in the ROM 808. The computer architecture 800 further includes a mass storage device 812 for storing an operating system 814, other data, and one or more application programs.

The mass storage device 812 is connected to the CPU 802 through a mass storage controller (not shown) connected to the bus 810. The mass storage device 812 and its associated computer-readable media provide non-volatile storage for the computer architecture 800. Although the description of computer-readable media contained herein refers to a mass storage device, such as a solid-state drive, a hard disk or CD-ROM drive, it should be appreciated by those skilled in the art that computer-readable media can be any available computer storage media or communication media that can be accessed by the computer architecture 800.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

By way of example, and not limitation, computer storage media may include volatile and non-volatile, removable and non-removable media implemented in any method or technology for storage of information such as computer-readable instructions, data structures, program modules or other data. For example, computer media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer architecture 800. For purposes of the claims, the phrase "computer storage medium," "computer-readable storage medium" and variations thereof, does not include waves, signals, and/or other transitory and/or intangible communication media, per se.

According to various techniques, the computer architecture 800 may operate in a networked environment using logical connections to remote computers through a network 820 and/or another network (not shown). The computer architecture 800 may connect to the network 820 through a network interface unit 816 connected to the bus 810. It should be appreciated that the network interface unit 816 also may be utilized to connect to other types of networks and remote computer systems. The computer architecture 800 also may include an input/output controller 818 for receiving and processing input from a number of other devices, including a keyboard, mouse, or electronic stylus (not shown in FIG. 8). Similarly, the input/output controller 818 may provide output to a display screen, a printer, or other type of output device (also not shown in FIG. 8). It should also be appreciated that via a connection to the network 820 through a network interface unit 816, the computing architecture may enable DNN module 105 to communicate with the computing environments 100.

It should be appreciated that the software components described herein may, when loaded into the CPU 802 and/or the DNN Module 105 and executed, transform the CPU 802 and/or the DNN Module 105 and the overall computer architecture 800 from a general-purpose computing system into a special-purpose computing system customized to facilitate the functionality presented herein. The CPU 802 and/or the DNN Module 105 may be constructed from any number of transistors or other discrete circuit elements and/or chipset, which may individually or collectively assume any number of states. More specifically, the CPU 802 and/or the DNN Module 105 may operate as a finite-state machine, in response to executable instructions contained within the software modules disclosed herein. These computer-executable instructions may transform the CPU 802 by specifying how the CPU 802 transitions between states, thereby transforming the transistors or other discrete hardware elements constituting the CPU 802.

Encoding the software modules presented herein also may transform the physical structure of the computer-readable media presented herein. The specific transformation of physical structure may depend on various factors, in different implementations of this description. Examples of such factors may include, but are not limited to, the technology used to implement the computer-readable media, whether the computer-readable media is characterized as primary or secondary storage, and the like. For example, if the computer-readable media is implemented as semiconductor-based memory, the software disclosed herein may be encoded on the computer-readable media by transforming the physical state of the semiconductor memory. For example, the software may transform the state of transistors, capacitors, or other discrete circuit elements constituting the semiconductor memory. The software also may transform the physical state of such components in order to store data thereupon.

As another example, the computer-readable media disclosed herein may be implemented using magnetic or optical technology. In such implementations, the software presented herein may transform the physical state of magnetic or optical media, when the software is encoded therein. These transformations may include altering the magnetic characteristics of particular locations within given magnetic media. These transformations also may include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer architecture 800 in order to store and execute the software components presented herein. It also should be appreciated that the computer architecture 800 may include other types of computing devices, including hand-held computers, embedded computer systems, personal digital assistants, and other types of computing devices known to those skilled in the art. It is also contemplated that the computer architecture 800 may not include all of the components shown in FIG. 8, may include other components that are not explicitly shown in FIG. 8, or may utilize an architecture completely different than that shown in FIG. 8.

Computing system 800, described above, can be deployed as part of a computer network. In general, the above description for computing environments applies to both server computers and client computers deployed in a network environment.

Figure 9:
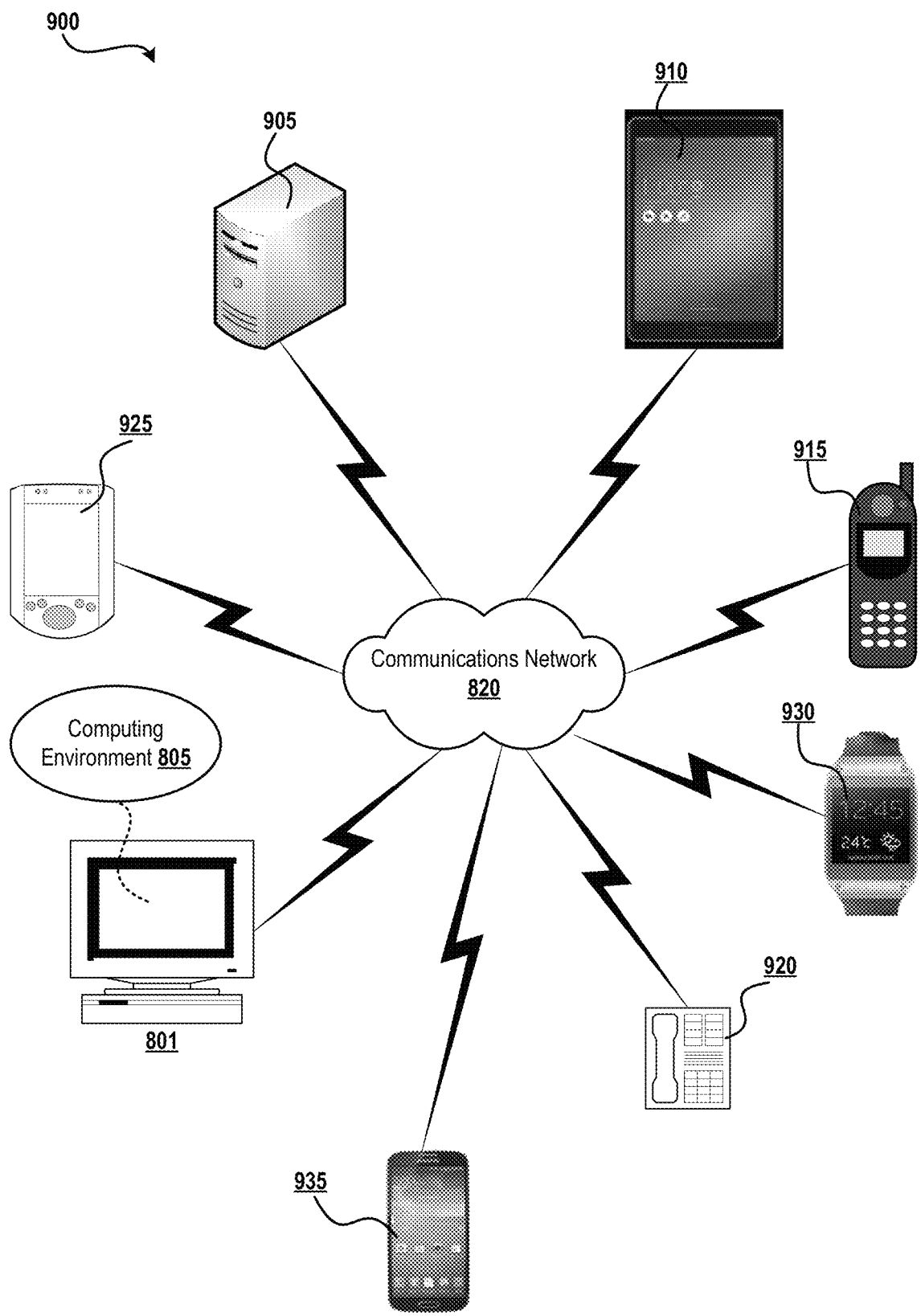
FIG. 9 shows additional details of illustrative computing devices cooperating in accordance with the herein described systems and methods.

FIG. 9 illustrates an exemplary illustrative networked computing environment 900, with a server in communication with client computers via a communications network, in which the herein described apparatus and methods may be employed. As shown in FIG. 9, server(s) 905 may be interconnected via a communications network 820 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing environments such as a tablet personal computer 910, a mobile telephone 915, a telephone 920, a personal computer(s) 801, a personal digital assistant 925, a smart phone watch/personal goal tracker (e.g., Apple Watch, Samsung, FitBit, etc.) 930, and a smart phone 935. In a network environment in which the communications network 820 is the Internet, for example, server(s) 905 can be dedicated computing environment servers operable to process and communicate data to and from client computing environments 801, 910, 915, 920, 925, 930, and 935 via any of a number of known protocols, such as, hypertext transfer protocol (HTTP), file transfer protocol (FTP), simple object access protocol (SOAP), or wireless application protocol (WAP). Additionally, the networked computing environment 900 can utilize various data security protocols such as secured socket layer (SSL) or pretty good privacy (PGP). Each of the client computing environments 801, 810, 815, 820, 825, 830, and 835 can be equipped with computing environment 805 operable to support one or more computing applications or terminal sessions such as a web browser (not shown), or other graphical user interface (not shown), or a mobile desktop environment (not shown) to gain access to the server computing environment(s) 905.

Server(s) 905 may be communicatively coupled to other computing environments (not shown) and receive data regarding the participating user's interactions/resource network. In an illustrative operation, a user (not shown) may interact with a computing application running on a client computing environment(s) to obtain desired data and/or computing applications. The data and/or computing applications may be stored on server computing environment(s) 905 and communicated to cooperating users through client computing environments 901, 910, 915, 920, 925, 930, and 935, over an exemplary communications network 820. A participating user (not shown) may request access to specific data and applications housed in whole or in part on server computing environment(s) 905. These data may be communicated between client computing environments 801, 910, 915, 920, 925, 930, 935 and server computing environment(s) 905 for processing and storage. Server computing environment(s) 905 may host computing applications, processes and applets for the generation, authentication, encryption, and communication of data and applications and may cooperate with other server computing environments (not shown), third party service providers (not shown), network attached storage (NAS) and storage area networks (SAN) to realize application/data transactions.

EXAMPLE CLAUSES

The disclosure presented herein may be considered in view of the following clauses.

Example Clause A, a system for enhanced data processing using one or more virtualized hardware iterators in a neural network environment, the system comprising: at least one processor and at least one memory (210) in communication with the at least one processor, the at least one memory (210) having computer-readable instructions stored thereupon that, when executed by the at least one processor, cause the at least one processor to: receive one or more initialization parameters from a cooperating controller component of the neural network environment, the initialization parameters comprising data representative of the dimensions of the data to be processed by the neural network environment; load data from a cooperating memory component of the neural network environment; receive one or more instructions from a cooperating controller component of the neural network environment to traverse the loaded data according to one or more iterator operation types and the one or more initialization parameters; and communicate the traversed data as one or more portions to one or more processing components of the neural network environment.

Example Clause B, the system of Example Clause A, wherein the computer-readable instructions further cause the at least one processor to portion the traversed data into equal portions for communication to the one or more processing components.

Example Clause C, the system of Example Clause As and B, wherein the computer-readable instructions further cause the at least one processor to traverse the data according to a select data volume defined by the received one or more initialization parameters, the parameters comprising data comprising data height, data width, number of channels, and number of kernels.

Example Clause D, the system of Example Clauses A through C, wherein the computer-readable instructions further cause the at least one processor to traverse the data utilizing one or more sliding windows, the windows operative to select one or more data elements of the data volume as the one or more portions communicated to the one or more processing components.

Example Clause E, the system of Example Clauses A through D, wherein the computer-readable instructions further cause the at least one processor to traverse the loaded data using one or more sliding windows that straddle two or more line widths of the data volume.

Example Clause F, the system of Example Clauses A through E, wherein the computer-readable instructions further cause the at least one processor to insert one or more data paddings to the loaded data.

Example Clause G, the system of Example Clauses A through F, wherein the computer-readable instructions further cause the at least one processor to generate an output volume of data representative of data processed by the one or more neural processors, the output volume generated according to one or more instructions received by the cooperating controller component of the neural network environment.

Example Clause H, a computer-implemented method, comprising: receiving one or more initialization parameters from a cooperating controller component of the neural network environment, the initialization parameters comprising data representative of the dimensions of the data as a data volume comprising any of height, width, number of channels, and number of kernels; loading data from a cooperating memory component of the neural network environment; receiving one or more instructions from a cooperating controller component of the neural network environment to traverse the loaded data according to one or more iterator operation types and the one or more initialization parameters, the traversing of the loading data being utilizing one or more sliding windows operative on the data volume; and communicating the traversed data as one or more portions to one or more processing components of the neural network environment.

Example Clause I, the computer-implemented method of Clause H, further comprising: traversing the loaded data to generate equal portions of traversed data for communication to the one or more processing components.

Example Clause J, the computer-implemented method of Clauses H and I, wherein the sliding windows are operative to straddle two or more width lines of the data volume.

Example Clause K, the computer-implemented method of Clauses H through J, further comprising: inserting a padding sub-volume into the loaded data.

Example Clause L, the computer-implemented method of Clauses H through K, wherein the padding sub-volume is defined by the received one or more instructions from the cooperating controller components and by the received one or more initialization parameters.

Example Clause M, the computer-implemented method of Clauses H through L, further comprising: generating and output data volume for data processed by the one or more processing components of the neural environment, the output data volume defined by the received one or more instructions from the cooperating controller components.

Example Clause N, the computer-implemented method of Clauses H through M, further comprising: discarding one or more portions of the generated output data volume.

Example Clause O, the computer-implemented method of Clauses H through N, storing the traverse position of the loaded data as internal state data in a cooperating memory component of the neural network environment.

Example Clause P, a computer-readable storage medium having computer-executable instructions stored thereupon which, when executed by one or more processors of a computing device, cause the one or more processors of the computing device to: receive one or more initialization parameters from a cooperating controller component of the neural network environment, the one or more initialization parameters comprising data representative of the dimensions of data to be processed by the neural network environment, the dimensions of the data comprising data representative of the data's volume, the one or more initialization parameters comprising a physical memory addressing of the data to be processed; load data from a cooperating memory component of the neural network environment utilizing the one or more initialization parameters, the cooperating memory component operatively coupled to one or more processing components of the neural network environment; receive one or more instructions from a cooperating controller component of the neural network environment to traverse the loaded data according to one or more iterator operation types and the one or more initialization parameters, the instructions comprising one or more instruction to store data representative of the internal state of the traversing of the loaded data; and communicate the traversed data as one or more portions to the one or more processing components of the neural network environment.

Example Clause Q, the computer-readable storage medium of Clause P, wherein the instructions further cause the one or more processors of the computing device to: store the internal state data in a cooperating memory component of the neural network environment.

Example Clause R, the computer-readable storage medium of Clauses P and Q, wherein the instructions further cause the one or more processors of the computing device to: insert an additional data volume to the loaded data.

Example Clause S, the computer-readable storage medium of Clauses P through R, wherein the instructions further cause the one or more processors of the computing device to: generate an output data volume representative of data processed by the one or more processing components of the neural network environment.

Example Clause T, the computer-readable storage medium of Clauses P through S, wherein the instructions further cause the one or more processors of the computing device to: traverse the loaded data utilizing a logical data mapping of the loaded data, the traversing of the loaded data comprising applying one or more sliding windows to the logical data mapping to associate a portion of the loaded data to one or more physical memory addresses.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A system for enhanced data processing using one or more virtualized hardware iterators in a neural network environment, the system comprising:
   at least one processor;
   at least one hardware iterator operable to perform one or more data iteration functions; and
   at least one memory in communication with the at least one processor, the at least one memory having computer-readable instructions stored thereupon that, when executed by the at least one processor, cause the at least one processor to:
      receive one or more initialization parameters from a cooperating controller component of the neural network environment, the initialization parameters comprising data representative of the dimensions of the data to be processed by the neural network environment;
      load data from a cooperating memory component of the neural network environment;
      receive one or more instructions from the cooperating controller component of the neural network environment to traverse the loaded data according to one or more iterator operation types and the one or more initialization parameters;
      process the one or more instructions to select one or more portions of the loaded data according to one or more iterator operation types and the one or more initialization parameters; and
      communicate the one or more portions of the loaded data to one or more processing components of the neural network environment.

2. The system of claim 1, wherein the one or more portions of the loaded data are equal portions.

3. The system of claim 1, wherein the computer-readable instructions further cause the at least one processor to traverse the data according to a select data volume defined by the received one or more initialization parameters, the parameters comprising data comprising data height, data width, number of channels, number of kernels, and one or more other data descriptor.

4. The system of claim 3, wherein the computer-readable instructions further cause the at least one processor to traverse the data utilizing one or more sliding windows, the windows operative to select one or more data elements of the data volume as the one or more portions are communicated to the one or more processing components.

5. The system of claim 1, wherein the computer-readable instructions further cause the at least one processor to traverse the loaded data using one or more sliding windows that straddle a data dimensional boundary of the loaded data.

6. The system of claim 1, wherein the computer-readable instructions further cause the at least one processor to insert one or more data paddings to the loaded data.

7. The system of claim 1, wherein the computer-readable instructions further cause the at least one processor to generate an output volume of data representative of data processed by the one or more processing components, the output volume generated according to one or more instructions received by the cooperating controller component of the neural network environment.

8. A computer-implemented method, comprising:
   receiving one or more initialization parameters from a cooperating controller component of a computing device, the initialization parameters comprising data representative of the dimensions of the data as a data volume comprising any of height, width, number of channels, number of kernels and one or more other data descriptor;
   loading data from a cooperating memory component of the neural network environment;
   receiving one or more instructions from a cooperating controller component of the computing device to traverse the loaded data according to one or more iterator operation types and the one or more initialization parameters, the traversing of the loading data being utilizing one or more sliding windows operative on the data volume;
   processing the one or more instructions to select one or more portions of the loaded data according to one or more iterator operation types and the one or more initialization parameters; and
   communicating the one or more portions of the loaded data to one or more cooperating processing components of the computing device.

9. The computer-implemented method of claim 8, wherein the one or more portions of the loaded data are equal portions.

10. The computer-implemented method of claim 8, wherein the sliding windows are operative to straddle a data dimensional boundary of the data.

11. The computer-implemented method of claim 8, further comprising:
   inserting a padding sub-volume into the loaded data.

12. The computer-implemented method of claim 11, wherein the padding sub-volume is defined by the received one or more instructions from the cooperating controller components and by the received one or more initialization parameters.

13. The computer-implemented method of claim 8, further comprising:
   generating an output data volume for data processed by the one or more processing components, the output data volume defined by the received one or more instructions from the cooperating controller components.

14. The computer-implemented method of claim 13, further comprising:
   discarding one or more portions of the generated output data volume.

15. The computer-implemented method of claim 8, further comprising storing the traverse position of the loaded data as internal state data in a cooperating memory component of the computing device.

16. A computer-readable storage medium having computer-executable instructions stored thereupon which, when executed by one or more processors of a computing device, cause the one or more processors of the computing device to:
   receive one or more initialization parameters from a cooperating controller component of a computing device environment, the one or more initialization parameters comprising data representative of the dimensions of data to be processed by the computing device environment, the dimensions of the data comprising data representative of a volume of the data, the one or more initialization parameters comprising a physical memory addressing of the data to be processed;

load data from a cooperating memory component of the computing device environment utilizing the one or more initialization parameters, the cooperating memory component operatively coupled to one or more cooperating processing components of the computing device environment;

receive one or more instructions from a cooperating controller component of the computing device environment to traverse the loaded data according to one or more iterator operation types and the one or more initialization parameters, the instructions comprising one or more instruction to store data representative of the internal state of the traversing of the loaded data;

process the one or more instructions to select one or more portions of the loaded data according to one or more iterator operation types and the one or more initialization parameters; and communicate the one or more portions of the loaded data to the one or more processing components of the computing device environment.

17. The computer-readable storage medium of claim 16, wherein the instructions further cause the one or more processors of the computing device to:

store the internal state data in a cooperating memory component of the computing device environment.

18. The computer-readable storage medium of claim 17, wherein the instructions further cause the one or more processors of the computing device to:

insert an additional data volume to the loaded data.

19. The computer-readable storage medium of claim 16, wherein the instructions further cause the one or more processors of the computing device to:

generate an output data volume representative of data processed by the one or more processing components.

20. The computer-readable storage medium of claim 16, wherein the instructions further cause the one or more processors of the computing device to:

traverse the loaded data utilizing a logical data mapping of the loaded data, the traversing of the loaded data comprising applying one or more sliding windows to the logical data mapping to associate a portion of the loaded data to one or more physical memory addresses.

* * * * *